(12) United States Patent
Mulkens

(10) Patent No.: US 7,483,118 B2
(45) Date of Patent: Jan. 27, 2009

(54) LITHOGRAPHIC PROJECTION APPARATUS AND DEVICE MANUFACTURING METHOD

(75) Inventor: Johannes Catharinus Hubertus Mulkens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 17 days.

(21) Appl. No.: 10/890,389

(22) Filed: Jul. 14, 2004

(65) Prior Publication Data

US 2005/0030498 A1 Feb. 10, 2005

(30) Foreign Application Priority Data

Jul. 28, 2003 (EP) .................................. 03254699

(51) Int. Cl.
*G03B 27/42* (2006.01)
(52) U.S. Cl. .............................. 355/53; 355/30; 355/67
(58) Field of Classification Search .................. 355/30, 355/46, 53, 67, 71; 378/34, 35; 250/548
See application file for complete search history.

(56) References Cited

U.S. PATENT DOCUMENTS

| | | | |
|---|---|---|---|
| 3,573,975 A | 4/1971 | Dhaka et al. ................. 117/212 |
| 3,648,587 A | 3/1972 | Stevens ........................... 95/44 |
| 4,346,164 A | 8/1982 | Tabarelli et al. .............. 430/311 |
| 4,390,273 A | 6/1983 | Loebach et al. .............. 355/125 |
| 4,396,705 A | 8/1983 | Akeyama et al. ............. 430/326 |
| 4,480,910 A * | 11/1984 | Takanashi et al. .............. 355/30 |
| 4,509,852 A | 4/1985 | Tabarelli et al. ................ 355/30 |
| 4,907,021 A | 3/1990 | Yabu |
| 5,040,020 A | 8/1991 | Rauschenbach et al. ........ 355/53 |
| 5,260,151 A * | 11/1993 | Berger et al. .................... 430/5 |
| 5,528,118 A | 6/1996 | Lee |
| 5,610,683 A | 3/1997 | Takahashi ..................... 355/53 |
| 5,623,853 A | 4/1997 | Novak et al. |
| 5,715,039 A | 2/1998 | Fukuda et al. ................. 355/53 |
| 5,777,722 A * | 7/1998 | Miyazaki et al. ............... 355/53 |
| 5,825,043 A | 10/1998 | Suwa .......................... 250/548 |
| 5,874,820 A | 2/1999 | Lee |
| 5,900,354 A | 5/1999 | Batchelder .................. 430/395 |

(Continued)

FOREIGN PATENT DOCUMENTS

DE 206 607 2/1984

(Continued)

OTHER PUBLICATIONS

European Search Report dated Jun. 4, 2004 for EP 03254699.6.

(Continued)

*Primary Examiner*—Della J. Rutledge
(74) *Attorney, Agent, or Firm*—Pillsbury Winthrop Shaw Pittman, LLP

(57) ABSTRACT

A lithographic projection apparatus is disclosed where at least part of a space between a projection system of the apparatus and a substrate is filled with a liquid by a liquid supply system. The projection system is separated into two separate physical parts. With substantially no direct connection between the two parts of the projection system, vibrations induced in a first of the two parts by coupling of forces through the liquid filling the space when the substrate moves relative to the liquid supply system affects substantially only the first part of the projection system and not the other second part.

21 Claims, 5 Drawing Sheets

U.S. PATENT DOCUMENTS

| | | | |
|---|---|---|---|
| 5,969,441 A | 10/1999 | Loopstra et al. | |
| 6,191,429 B1 | 2/2001 | Suwa | 250/548 |
| 6,208,407 B1 | 3/2001 | Loopstra | |
| 6,236,634 B1 | 5/2001 | Lee et al. | 369/112 |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,560,032 B2 | 5/2003 | Hatano | 359/656 |
| 6,590,634 B1 | 7/2003 | Nishi et al. | |
| 6,600,547 B2 | 7/2003 | Watson et al. | |
| 6,603,130 B1 | 8/2003 | Bisschops et al. | 250/492.1 |
| 6,620,558 B2 * | 9/2003 | Kawata | 430/5 |
| 6,633,365 B2 | 10/2003 | Suenaga | 355/53 |
| 6,940,582 B1 | 9/2005 | Tanaka | |
| 2001/0008440 A1 * | 7/2001 | Hummel et al. | 355/30 |
| 2001/0010579 A1 * | 8/2001 | Nishi | 355/67 |
| 2002/0008863 A1 | 1/2002 | Taniguchi et al. | |
| 2002/0020821 A1 | 2/2002 | Van Santen et al. | 250/492 |
| 2002/0085192 A1 | 7/2002 | Miura et al. | |
| 2002/0163629 A1 | 11/2002 | Switkes et al. | 355/53 |
| 2002/0167652 A1 * | 11/2002 | Ueyama | 355/67 |
| 2002/0186357 A1 * | 12/2002 | Goto | 355/53 |
| 2003/0030916 A1 | 2/2003 | Suenaga | |
| 2003/0058426 A1 * | 3/2003 | Watson et al. | 355/73 |
| 2003/0117602 A1 * | 6/2003 | Kobayashi et al. | 355/53 |
| 2003/0123040 A1 | 7/2003 | Almogy | 355/69 |
| 2003/0174408 A1 | 9/2003 | Rostalski et al. | 359/642 |
| 2003/0210383 A1 * | 11/2003 | Bjorklund et al. | 355/53 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | 355/30 |
| 2004/0125351 A1 | 7/2004 | Krautschik | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesynchenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesynchenko et al. | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0264778 A1 | 12/2005 | Lof et al. | |
| 2005/0270505 A1 | 12/2005 | Smith | |
| 2006/0126045 A1 | 6/2006 | Ono et al. | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | A 06-168866 | 6/1994 |
| JP | 07-132262 | 5/1995 |
| JP | 07-220990 | 8/1995 |
| JP | A 08-166475 | 6/1996 |
| JP | A 08-316125 | 11/1996 |

| | | |
|---|---|---|
| JP | A 08-330224 | 12/1996 |
| JP | A 10-163099 | 6/1998 |
| JP | 10-228661 | 8/1998 |
| JP | A 10-214783 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | A 2000-505958 | 5/2000 |
| JP | 2001-091849 | 4/2001 |
| JP | A 2002-170765 | 6/2002 |
| JP | 2004-193252 | 7/2004 |
| WO | WO99/49504 | 9/1999 |
| WO | WO 01/22480 A1 | 3/2001 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A1 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/006416 A1 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/719,683, filed Nov. 24, 2003, Streefkerk et al.
U.S. Appl. No. 10/367,910, filed Feb. 19, 2003, Suwa et al.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2µm Fine Patterns Using Optical Projection Lithography with an Oil Immersion Lens", Jpn. J. Appl. Phys. vol. 31 (1992), pp. 4174-4177.
G. Owen et al., "1/8µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Japanese Office Action issued for Japanese Patent Application No. 2004-218022, dated Aug. 14, 2007.

Information Disclosure Statement filed Feb. 10, 2006 for U.S. Appl. No. 11/350,937.

Office Action dated Feb. 9, 2007 issued for U.S. Appl. No. 11/350,937.

* cited by examiner

LITHOGRAPHIC PROJECTION APPARATUS AND DEVICE MANUFACTURING METHOD

This application claims priority from European patent application EP 03254699.6, filed Jul. 28, 2003, which is incorporated herein in its entirety.

FIELD

The present invention relates to a lithographic projection apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

—A Mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

—A Programmable Mirror Array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

—A Programmable LCD Array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid in a localized area between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the final element relative to the substrate, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the final element relative to the substrate, though this does not need to be the case. Various orientations and numbers of in- and out-lets positioned around the final element are possible, one example is illustrated in FIG. 3 in which four sets of an inlet with an outlet on either side are provided in a regular pattern around the final element. There are other ways of putting the localized area solution into effect, see for example U.S. patent application Ser. No. 10/705,783.

A problem that may occur is that when a substrate is scanned normal forces and shear forces are coupled through the liquid and passed onto a final element of the projection system. This may cause unwanted vibrations in the projection system. Furthermore, the projection system is typically attached to a reference frame which carries sensitive instruments required for accurate alignment during the imaging process. Any vibrations of the projection system may therefore have an adverse effect on the accuracy of the apparatus and on the quality of the devices manufactured.

SUMMARY

Accordingly, it would be advantageous, for example, to reduce the transmission of forces coupled by the liquid when the substrate moves relative to the projection system in an immersion lithography apparatus.

According to an aspect, there is provided a lithographic apparatus, comprising:

an illumination system arranged to condition a radiation beam;

a support structure configured to hold a patterning device, the patterning device being capable of imparting the radiation beam with a pattern;

a substrate table configured to hold a substrate;

a projection system arranged to project the patterned radiation beam onto a target portion of the substrate, the projection system comprising two separate physical parts that are decoupled, wherein each part comprises an optical element of the projection system; and a liquid supply system configured to at least partly fill a space between the projection system and the substrate, with a liquid.

By separating a projection system into two separate parts which are decoupled, i.e. there is no direct mechanical connection between them, any forces coupled through the liquid primarily act only on a second part of the two parts of the projection system. The first part of the two parts of the projection system is isolated from the second part and substantially no force coupled through the liquid is exerted upon it. Therefore, any vibrations arising because of coupled forces through the liquid primarily affect only the second part of the projection system. Thus, vibration sensitive optical elements may be placed in the relatively vibration free first part of the projection system to improve the quality of the projected image.

In an embodiment, the parts of the projection system are separated at a location between two lens elements having a large curvature radius and/or between two lens elements where the patterned beam is collimated. By separating the projection system at such a location, the alignment between the two parts of the projection system may be less sensitive to lateral movements i.e. those movements horizontal to the substrate. This may make the apparatus simpler to construct because lateral tolerances are correspondingly lower. In an embodiment, those elements having a larger curvature radius are chosen over the rest of the optical elements in the projection system.

In an embodiment, the projection system is a telecentric lens system and the parts are separated in a pupil plane of the lens system. A telecentric system comprises a first and second lens group separated by a pupil (or aperture). A pupil plane (or aperture plane) (which includes any substantially conjugate plane) creates an ideal location at which to separate a telecentric lens system into two parts. At the pupil location, the lens system is less sensitive to movements in the illumination direction i.e. movements perpendicular to the substrate. Therefore, in such an apparatus the tolerance for alignment between the first and second parts of the projection system may not required to be unmanageably high and construction may be simplified.

In an embodiment, the apparatus further comprises:

a sensor configured to establish a position between a first optical element in the first part of the projection system and a second optical element in the second part of the projection system;

an actuator configured to vary the position between the first and second optical elements; and a controller configured to control the actuator on the basis of output from the sensor to maintain a predetermined position between the first and second optical elements.

For design reasons, it may not always be possible to separate a projection system between lens elements having a large curvature radius, or at the aperture of a telecentric lens system. If a projection system is split at an arbitrary location, it is likely that it will be intolerant to variations in the separation of the elements, for example, in the beam direction i.e. the optical axis which is perpendicular to the substrate. This construction allows a predetermined position between two lens elements, one in the first part and one in the second part, to be maintained. The apparatus can also be applied when a lens system is split between lenses having a large curvature radius, or at the aperture location of a telecentric lens system to further improve the accuracy of their alignment. In an embodiment, the position is a distance in the direction substantially parallel to the direction of the optical axis of the projection system.

In an embodiment, the apparatus further comprises:

an actuator configured to vary the position between the first and second parts; and a controller configured to control the actuator to maintain a predetermined relative positioning between the first and second parts.

This may allow a relative position between the first and second parts of the projection system to be maintained, and reduce a likelihood of misalignment between the two parts reducing the image quality. The controller may use feedforward or feedback control.

In an embodiment, the second part of the projection system is attached to the liquid supply system. If the second part of the projection system is attached to the liquid supply system, the construction of the apparatus may be simplified. The first part may then be fixed to a reference frame, or another part of the lithographic apparatus as required. The second part is supported by the liquid supply system and therefore any vibrations in the second part may not be substantially transmitted to the reference frame.

In an embodiment, the liquid supply system comprises a seal member configured to seal liquid in at least part of the space between the projection system and the substrate. It may therefore be possible to fill only a localized area with liquid.

In an embodiment, the seal member further comprises a contactless seal configured to seal liquid in the space.

In an embodiment, the second part is at least partly supported by a resilient member connected between the second part and a base frame.

In an embodiment, the base frame is decoupled from a frame to which the first part is attached.

According to a further aspect, there is provided a device manufacturing method comprising:

providing a liquid to a space between a substrate on a substrate table of a lithographic apparatus and a first part of a projection system of the lithographic apparatus, a second part of the projection system substantially decoupled from the first part; and projecting a patterned beam of radiation, using the first and second parts of the projection system, through the liquid onto a target portion of a substrate.

Transmission of vibrations to a first part of a projection system ma e substantially reduced or eliminated by mechanical isolation between the first part and a second part of the projection system.

In an embodiment, the method further comprises:

establishing a position between a first optical element in the first part of the projection system and a second optical element in the second part of the projection system; and adjusting the position of the first optical element, the second optical element, or both such that the established position is maintained at a predetermined position.

By establishing a position and adjusting the position of optical elements in the first and second parts of the projection system of a lithographic apparatus, the position between the two optical elements may be maintained at a predetermined value. This method may allow the projection system to be split at an arbitrary position, and maintain the correct separation between optical elements in the first and second parts of the projection system. In an embodiment, the position is a distance in the direction substantially parallel to the direction of the optical axis of the projection system.

In an embodiment, the method further comprises adjusting the relative positioning of the first and second parts of the projection system to maintain a predetermined relative positioning between them. Thus, the relative position may be maintained to reduce likelihood of a misalignment between the two parts that may reduce the image quality.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
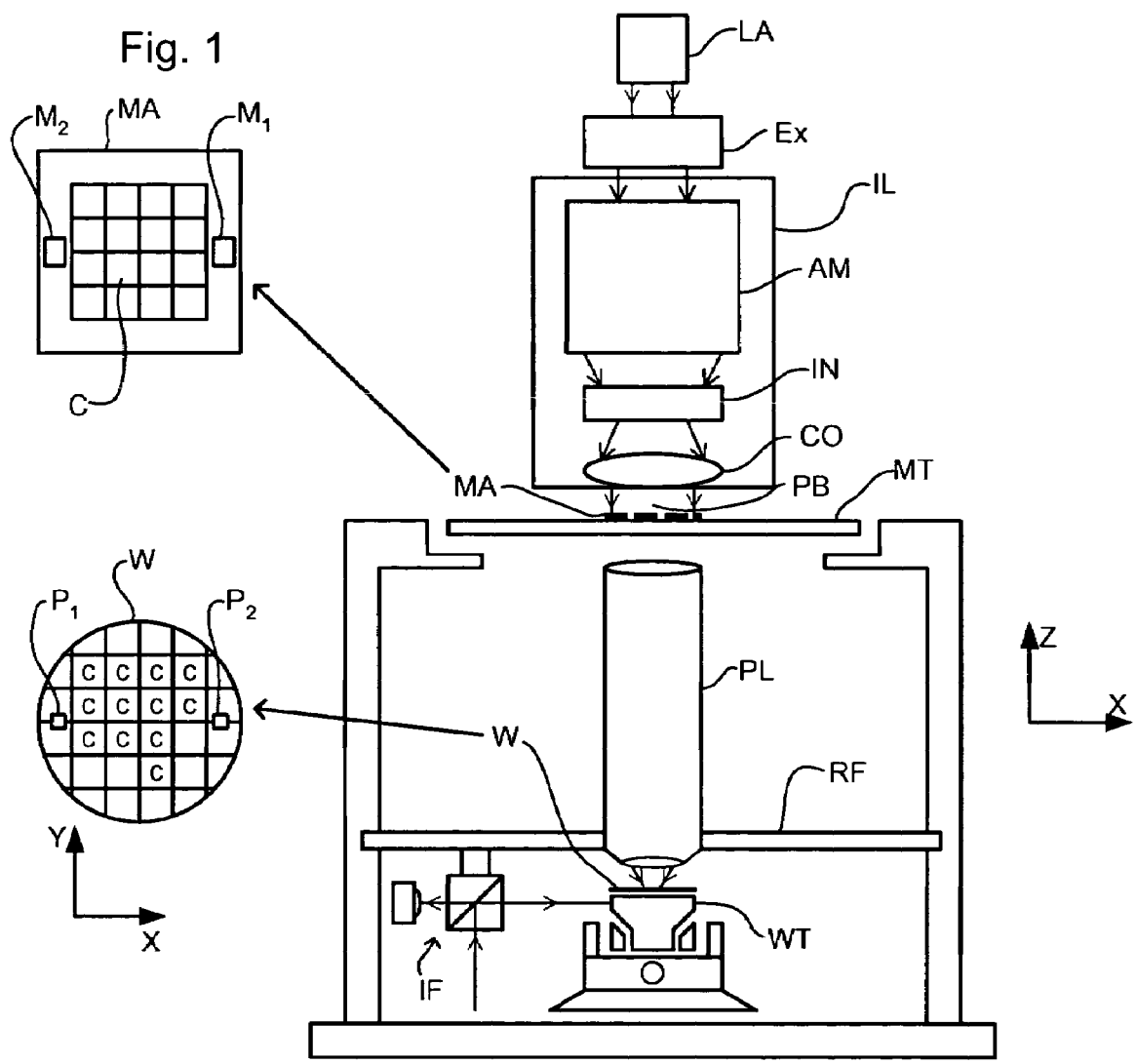
FIG. 1 depicts a lithographic projection apparatus according to an embodiment of the invention.
Figure 2:
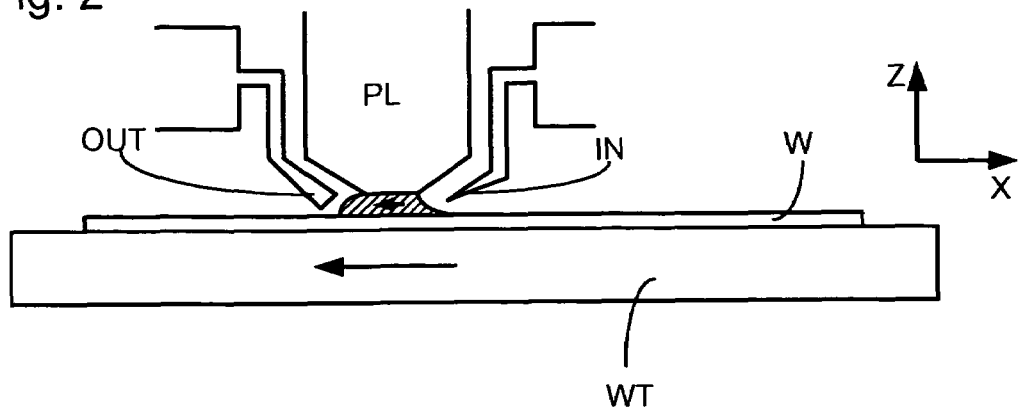
FIG. 2 depicts a cross-section of a proposed liquid supply system.
Figure 3:
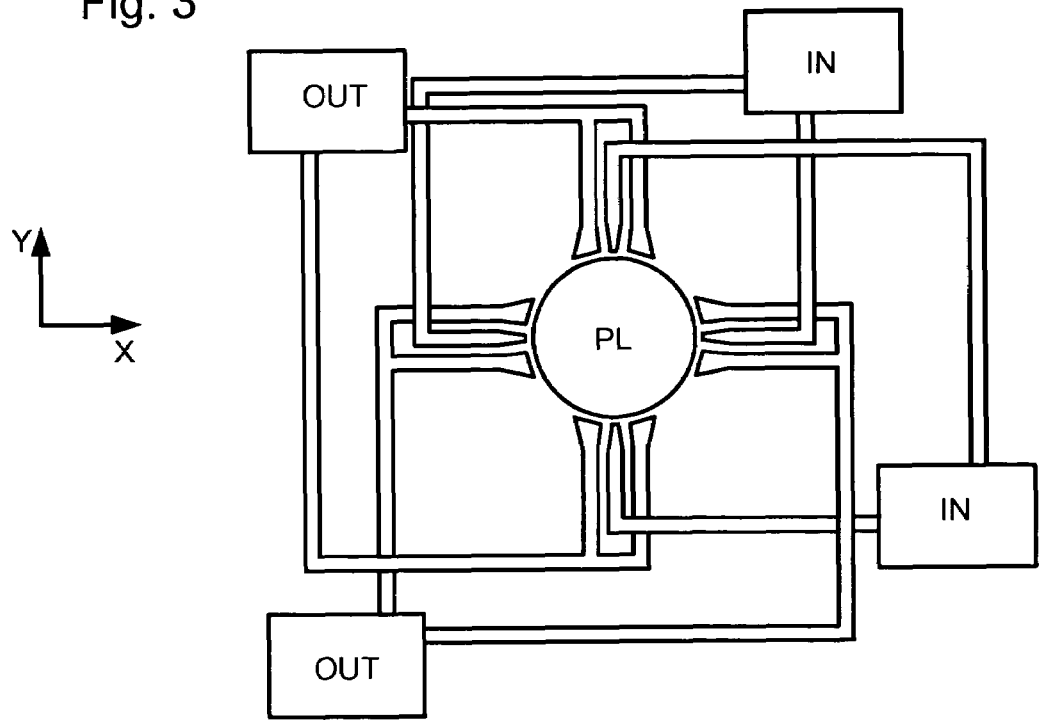
FIG. 3 depicts a plan view of the proposed liquid supply system depicted in FIG. 2.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to a first positioning device for accurately positioning the mask with respect to item PL;

a second object table (substrate table) WT provided with a substrate holder for holding a substrate W (e.g. a resist-coated silicon wafer), and connected to a second positioning device for accurately positioning the substrate with respect to item PL;

a projection system ("lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 4:
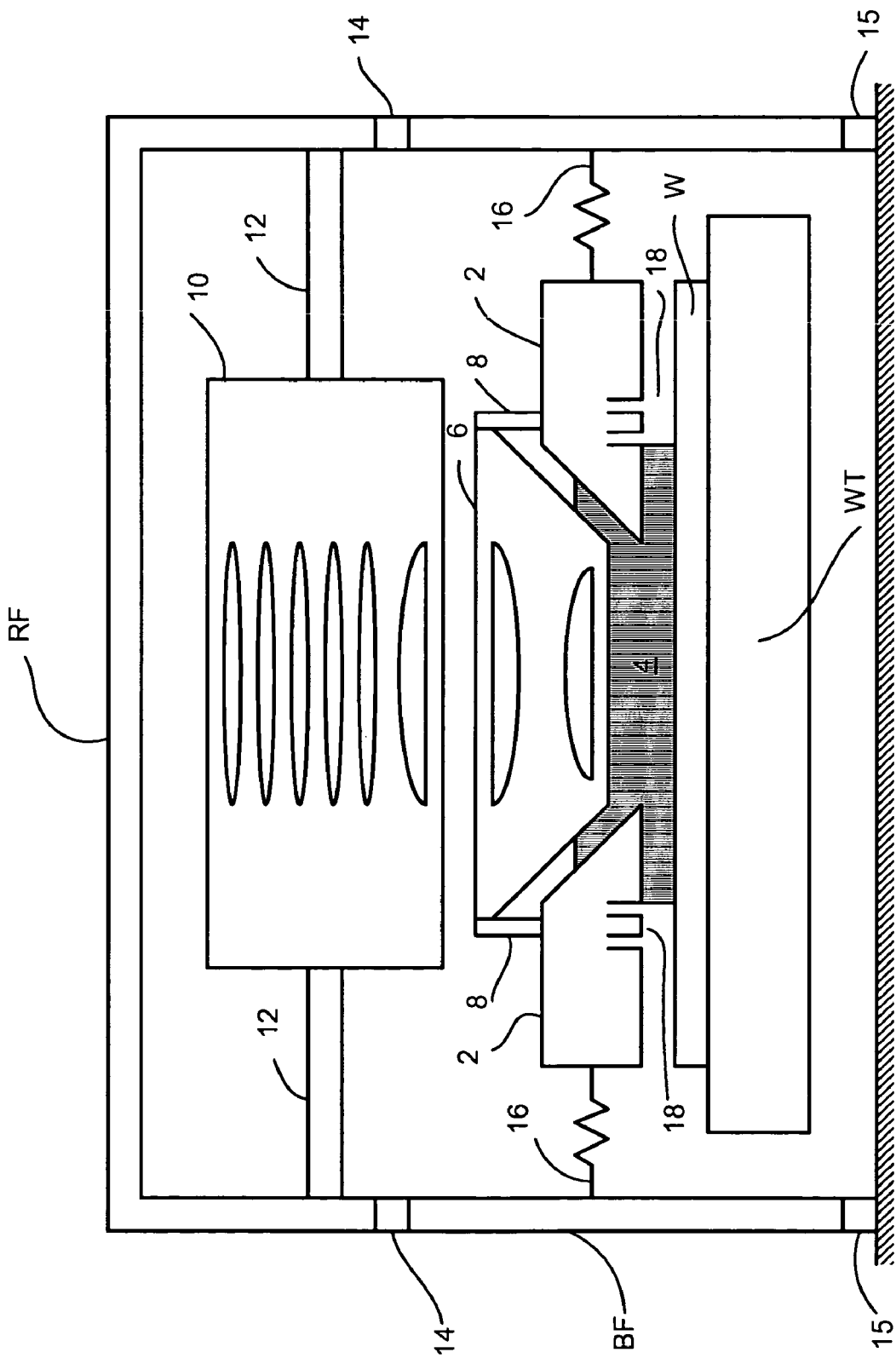
FIG. 4 depicts a projection system and liquid supply system according to a first embodiment of the invention.

FIG. 4 depicts a projection system and liquid supply system according to a first embodiment. The liquid supply system comprises a seal member 2 which extends along at least a part of a boundary of the space 4 between a final element of the projection system and a substrate table WT. The seal member 2 is substantially stationary relative to the projection system in the XY plane and a seal is formed between the seal member 2 and the surface of the substrate W. In this embodiment, the seal is a contactless seal such as a gas seal and is formed by a gas bearing 18. The seal member 2 is supported above the surface of the substrate by the gas bearing 18.

A lower part 6 of the projection system is attached to the seal member 2 by connecting members 8. An upper part 10 of the projection system is fixed by connecting members 12 to a reference frame RF. The reference frame RF is connected by gas bearings 14 to a base frame BF of the lithographic apparatus. Further, gas bearings 15 support the base frame BF above the ground Liquid is supplied via the seal member 2 to fill a space 4 between a lower part 6 of a projection system and the substrate W. The gas bearing 18 also functions as a seal to retain the liquid in the space 4 and prevent leakage of the liquid over the substrate W.

In use, the lower part 6 and upper part 10 of the projection system function as a single lens system. Light from an illumination source passes first through the upper part 10 and then through the lower part 6 before finally passing through the liquid filled space 4 and hitting the surface of the substrate W. In this embodiment, the projection system is a telecentric lens system. The separation between the optical elements in the upper part 10 and the optical elements in the lower part 6 is determined by the location of the pupil (or aperture) in the projection system. The separation point is located at the position of the aperture. This may be advantageous because at this point the light rays are parallel and the projection system is relatively insensitive to variations in alignment in the Z direction (i.e. direction of the optical axis, which is perpendicular to the substrate W). In an embodiment, the projection system is designed so that the aperture is also between two lens elements having a large curvature radius. If the separation point is between two lens elements having a large curvature radius, for example plan plate or close to plan plate lenses, the system may be less sensitive to variations in the X and Y directions (i.e. parallel to the surface of the substrate W). In an embodiment, the system is separated between two lens elements having a curvature radius such that the sine of the incident angle, $\sin(\theta)$, is less than 0.3. However, other curvature radius ranges are also possible, for example $\sin(\theta)$ can be less than 0.5 or less than 0.7.

During imaging, the substrate table WT moves the substrate W relative to the liquid supply system and the projection system. This may produce a coupling force in the liquid filling the space 4 which may be transmitted to the lower part 6 of the projection system. However, because this lower part 6 is attached to the seal member 2 these forces are transferred to the seal member 2. The seal member 2 is supported by resilient members 16. In this embodiment, the resilient members are mechanical springs. The springs provide some support to the seal member and also act to damp any vibrations which are induced due to the effect of the forces.

The lower part 6 of the projection system is rigidly connected via connecting members 8 to the seal member 2. Therefore, if it is desired to alter the position of the lower part 6 in the Z direction (perpendicular to the surface of the substrate W) the seal member 2 is moved. This may be achieved by altering the operating pressure of the gas bearing 18 supporting the seal member 2. For example, to move the seal member 2 and lower part 6 upwards the pressure in the bearing 18 is increased to create a net upwards force on the seal member which causes the seal member to move upwards. When the desired position is reached the pressure is reduced to a steady state pressure (i.e. the force exerted by the bearing is equal to the weight of the seal member) and the seal member 2 and lower part 6 are then supported at the new position.

The lower part 6 of the projection system is still subject to vibrations arising due to coupling of forces via the liquid in the space 4. Therefore, it is advisable that the optical elements in the lower part 6 are fixed. If the optical elements are free to move within the lower part 6, the effects of vibrations in the lower part 6 may induce a resonant vibration in one of the optical elements. This could have an adverse effect on the imaging quality, for example there may be a loss of contrast.

Conversely, the upper part 10 remains essentially vibration free. It is supported by the reference frame RF which is substantially isolated from external vibrations to ensure the accuracy of measurement from sensors supported on the frame. The upper part 10 may therefore include a combination of fixed or more loosely mounted optical elements depending on the design requirements.

Although this embodiment has described separating the projection system at the pupil of a telecentric lens, other separation points are possible. For example, if the system is split between the two lenses having the largest curvature radius, the separation will be relatively insensitive to lateral alignment (i.e. parallel to the substrate). A projection system could be separated at this point and the apparatus can be constructed without the need to align the two parts of the projection system to very high tolerances. The projection system can also be separated between any two lenses of large curvature radius, not just the two with the largest curvature radius.

It will be appreciated that the construction of this embodiment can easily be adapted for various types of liquid supply apparatus, it is not limited to the gas-sealed local area liquid supply system described. For example, the liquid supply system may contain the liquid in a localized area by means other than a gas seal. Likewise, the liquid supply system may immerse the whole substrate in a bath of liquid, and not just immerse a localized area of the substrate.

Embodiment 2

Figure 5:
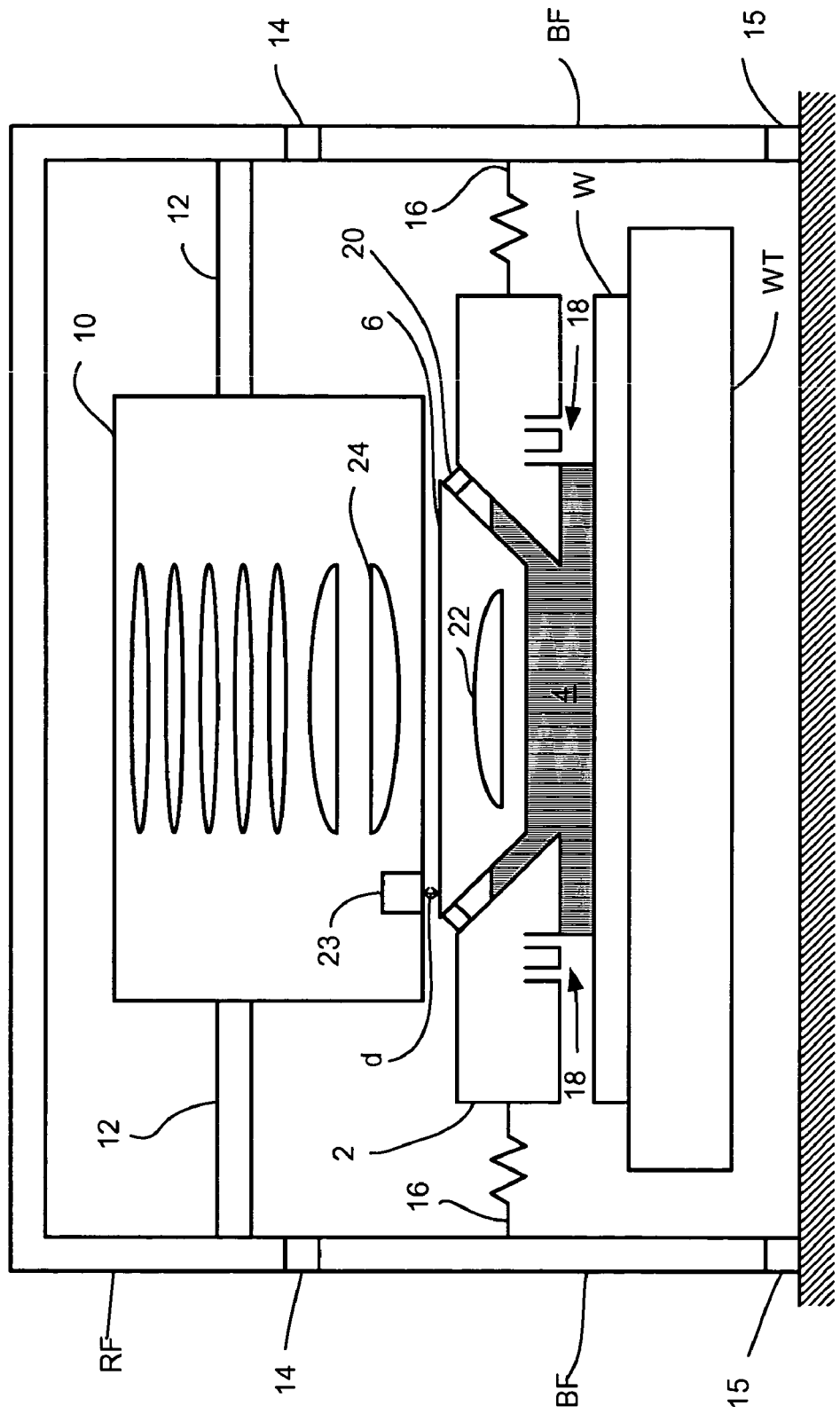
FIG. 5 depicts a projection system and liquid supply system according to a second embodiment of the invention.

A second embodiment of a projection system is illustrated in FIG. 5. The construction of this embodiment is the same as for the first embodiment save as described below.

In this embodiment, the separation in the projection system occurs between an arbitrary pair of lens elements 22 and 24. To minimize the effect of the vibrations induced by the coupling of forces through liquid filling the space 4, only one lens element 22 is present in the lower part 6. Therefore, only one lens element is affected by the induced vibrations. However, the projection system is more sensitive to misalignment in a vertical, Z direction (i.e. perpendicular to the substrate) than at the separation position of the above described first embodiment. It may therefore be advantageous to control the position of the lower part 6 with respect to the upper part 10 to maintain a predetermined distance between them. This distance control may be used to give the correct focus to the projection system.

The predetermined distance may be maintained by measuring the distance d with a sensor 23, for example an interferometer. The vertical position of the lower part 6 relative to the seal member 2 is then be controlled using one or more actuators 20 which connect the lower part 6 to the seal member 2. In an embodiment, the actuators 20 are Lorentz motors. However, they could also be Maxwell motors or other similar actuators. A simple feedback controller using proportional, integral and derivative control is used in this embodiment, but other types of controller are also suitable. The controller compares the measured distance d to a desired distance and controls the actuators 20 to position the lower part 6 so that the desired distance is maintained. If the desired distance d is not maintained the gain of immersing the substrate in a liquid may be lost, because the system will be out of focus in air and not in the liquid.

In this embodiment, the distance between the two lens elements 24 and 22 is calculated by measuring the distance d between the upper part 10 and the lower part 6. The lens elements 22 and 24 are fixed and therefore their position with respect to the upper 10 and lower 6 parts of the projection system is known. However, it is also possible to measure the distance between the two lens elements 22 and 24 directly and use this to control the actuator 20.

The control system may also control the position of the lower part 6 by a two-stage system if desired. In such a system the position of the seal member 2 is adjusted by the gas bearing 18 as described above for the first embodiment. The actuator 20 is then used for fine relative movements of the lower part 6 to the seal member 2.

While this embodiment has described controlling the vertical distance between the two lens elements 22 and 24, the control system can also be extended to control the relative position of the two parts: translation in the X and Y directions and/or rotations about the X axis and the Y axis. This will further improve the accuracy and quality of the projected image, particularly in the case where the lens elements 22 and 24 have a small curvature radius and therefore are more sensitive to variations in the X and Y directions. The relative position (translation and/or rotation) in the X-Y plane can be calculated by measuring the position of the first and the second parts with interferometers.

Although this embodiment has split the projection system such that only the final lens element 22 is in the lower part 6, any other split is possible. The lower part 6 can contain any number of optical elements, for example two, three, four, etc.

It will be appreciated that the control system of this embodiment can be applied to the first embodiment to improve accuracy of alignment in the vertical, Z direction.

Although in this embodiment only the lower part 6 is moved, the control system may also move the upper part 10 or both the upper 10 and lower 6 parts to maintain the correct separation.

This embodiment enables a projection system to be split in an arbitrary plane. All of the optical elements which are located in the upper part 10 are substantially isolated from vibrations induced by coupling forces through the liquid filling the space 4.

Embodiment 3

Figure 6:
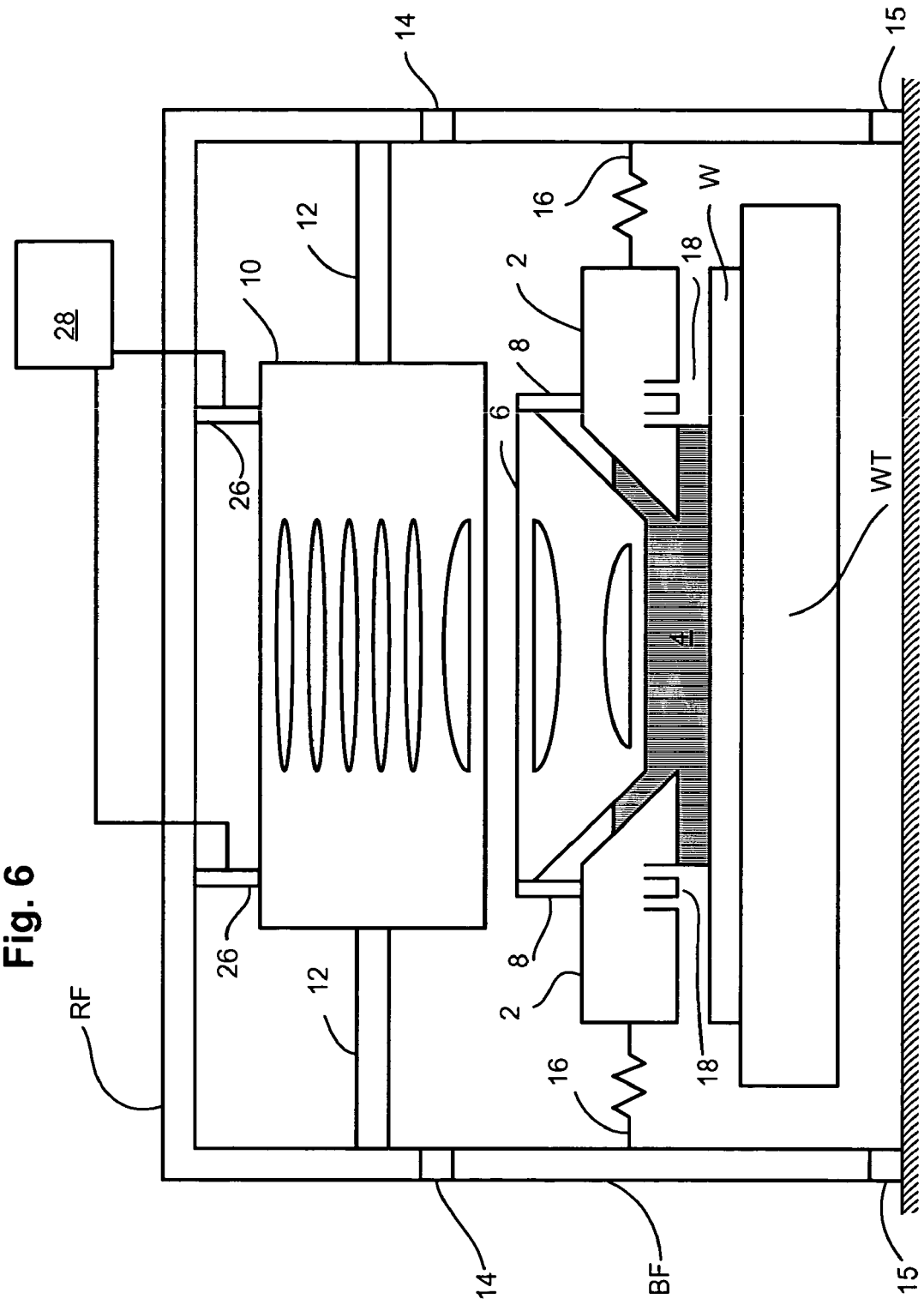
FIG. 6 depicts a projection system and liquid supply system according to a third embodiment of the invention.

A third embodiment is depicted in FIG. 6. The construction of this embodiment is the same as for the first embodiment, save as described below.

In this embodiment, one or more actuators 26 are attached to the upper part 10 of the projection system. The actuators 26 are controlled by the control system 28 to maintain a correct relative position of the upper 10 and lower 6 parts of the projection system. This allows the accuracy to be further improved, because even in the case where the projection system is split at a location which is relatively insensitive to misalignment, there can still be some degradation of the image if the two parts are not aligned properly.

The control system 28 controls the actuators 26 to maintain a predetermined relative position of the two lens parts with six degrees of freedom: translation in the X, Y and Z axes and rotation about these three axes. It is also possible to use fewer degrees of freedom, for example four, three, or two. The control system 28 has an input of calibration data and uses a feedforward control method. However, it also possible for the control system 28 to use feedback control with an input of the measured relative position of the upper 10 and lower 6 parts in a similar way to the above described second embodiment.

In an embodiment, to reduce vibrations in the upper part 10 of the projection system during imaging, the control system 28 only operates the actuators 26 when the apparatus is not exposing a substrate.

Although the description of this embodiment has described moving the upper part to maintain a relative positioning of the upper and lower parts, the same benefits can be achieved by moving the upper part to maintain a relative positioning of the two lens elements adjacent to the split in the projection system.

It will be appreciated that this embodiment can also be combined with the above described second embodiment.

All the embodiments can be applied to a system where only the substrate or where the entire substrate table is immersed in liquid, as well as the localized area liquid supply systems described.

While specific embodiments of the invention have been described above, it will be appreciated that the invention may be practiced otherwise than as described. The description is not intended to limit the invention.

The invention claimed is:

1. A lithographic projection apparatus comprising:
   an illumination system arranged to condition a radiation beam;
   a support structure configured to hold a patterning device, the patterning device being capable of imparting the radiation beam with a pattern;
   a substrate table configured to hold a substrate;
   a projection system arranged to project the patterned radiation beam onto a target portion of the substrate, the projection system comprising a first part and a second part that are two separate physical parts that are substantially isolated from each other such that vibrations in the second part are substantially prevented from being transferred to the first part, wherein each part comprises an optical element of the projection system and the first and second parts are not attached to and movable with the substrate; and
   a liquid supply system configured to at least partly fill a space between the projection system and the substrate, with a liquid.

2. The lithographic apparatus according to claim 1, wherein the parts of the projection system are separated at a location between two lens elements having a large curvature radius, between two lens elements where the patterned beam is collimated, or both.

3. The lithographic apparatus according to claim 1, wherein the projection system is a telecentric lens system and the parts are separated at a pupil plane of the lens system.

4. The lithographic apparatus according to claim 1, further comprising:
   a sensor configured to establish a position between a first optical element in the first part of the projection system and a second optical element in the second part of the projection system;
   an actuator configured to vary the position between the first and second optical elements; and
   a controller configured to control the actuator on the basis of output from the sensor to maintain a predetermined position between the first and second optical elements.

5. The lithographic apparatus according to claim 4, wherein the position is a distance in the direction substantially parallel to the direction of the optical axis of the projection system.

6. The lithographic apparatus according to claim 1, further comprising:
   an actuator configured to vary the position between the first and second parts; and
   a controller configured to control the actuator to maintain a predetermined relative positioning between the first and second parts.

7. The lithographic apparatus according to claim 1, wherein the second part of the projection system is attached to the liquid supply system.

8. The lithographic apparatus according to claim 1, wherein the liquid supply system comprises a seal member configured to seal liquid in at least part of the space between the projection system and the substrate.

9. The lithographic apparatus according to claim 8, wherein the seal member further comprises a contactless seal configured to seal liquid in the space.

10. The lithographic apparatus according to claim 1, wherein the second part is at least partly supported by a resilient member connected between the second part and a base frame.

11. The lithographic apparatus according to claim 10, wherein the base frame is decoupled from a frame to which the first part is attached.

12. A device manufacturing method, comprising:
   providing a liquid to a space between a substrate on a substrate table of a lithographic apparatus and a first part of a projection system of the lithographic apparatus, a second part of the projection system being substantially isolated from the first part such that vibrations in the second part are substantially prevented from being transferred to the first part and the first and second parts are not attached to and movable with the substrate; and
   projecting a patterned beam of radiation, using the first and second parts of the projection system, through the liquid onto a target portion of a substrate.

13. The method according to claim 12, further comprising:
   establishing a position between a first optical element in the first part of the projection system and a second optical element in the second part of the projection system; and
   adjusting the position of the first optical element, the second optical element, or both such that the established position is maintained at a predetermined position.

14. The method according to claim 13, wherein the position is a distance in the direction substantially parallel to the direction of the optical axis of the projection system.

15. The method according to claim 12, further comprising adjusting the relative positioning of the first and second parts of the projection system to maintain a predetermined relative positioning between them.

16. The method according to claim 12, wherein the parts of the projection system are separated at a location between two lens elements having a large curvature radius, between two lens elements where the patterned beam is collimated, or both.

17. The method according to claim 12, wherein the projection system is a telecentric lens system and the parts are separated at a pupil plane of the lens system.

18. The method according to claim 12, comprising sealing the liquid in at least part of the space between the projection system and the substrate using a seal member.

19. The method according to claim 18, wherein sealing the liquid comprises sealing the liquid in the space using a contactless seal.

20. The method according to claim 12, comprising at least partly supporting the second part using a resilient member connected between the second part and a base frame of the lithographic apparatus.

21. The method according to claim 20, wherein the base frame is decoupled from a frame to which the first part is attached.

* * * * *